United States Patent [19]
Marshall et al.

[11] 3,781,689
[45] Dec. 25, 1973

[54] TRISTATE PULSE GENERATOR FOR PRODUCING CONSECUTIVE PAIR OF PULSES

[75] Inventors: Howard D. Marshall, Santa Clara; Gary B. Gordon; Jesse E. Pipkin, both of Cupertino; Robin Adler, San Jose, all of Calif.

[73] Assignee: Hewlett-Packard Company, Palo Alto, Calif.

[22] Filed: Apr. 17, 1972

[21] Appl. No.: 244,475

[52] U.S. Cl. ............... 328/61, 307/247 A, 307/254, 307/255, 307/262, 307/268, 328/57
[51] Int. Cl. .......................... H03k 1/00, H03k 5/00
[58] Field of Search .................... 307/254, 255, 262, 307/268, 270, 247 A; 328/57, 60, 61

[56] References Cited

UNITED STATES PATENTS

| | | | |
|---|---|---|---|
| 3,194,979 | 7/1965 | Toy | 307/263 X |
| 3,359,433 | 12/1967 | Thauland | 307/262 X |
| 3,493,842 | 2/1970 | Robrock | 307/262 X |
| 3,585,407 | 6/1971 | Vinson | 307/255 |
| 3,599,098 | 8/1971 | McPhail | 307/262 X |
| 3,649,851 | 3/1972 | Cohen | 307/262 X |
| 3,624,518 | 11/1971 | Dildy, Jr. | 307/247 A |
| 3,381,088 | 4/1968 | Lentz et al. | 307/262 |

*Primary Examiner*—Stanley D. Miller, Jr.
*Attorney*—A. C. Smith

[57] ABSTRACT

An improved manually-triggerable pulse generator has a high-impedance output in one operating state and alternate high-and-low-level logic states of low output impedance in remaining operating states for operation as a source of test pulses in digital circuitry.

2 Claims, 1 Drawing Figure

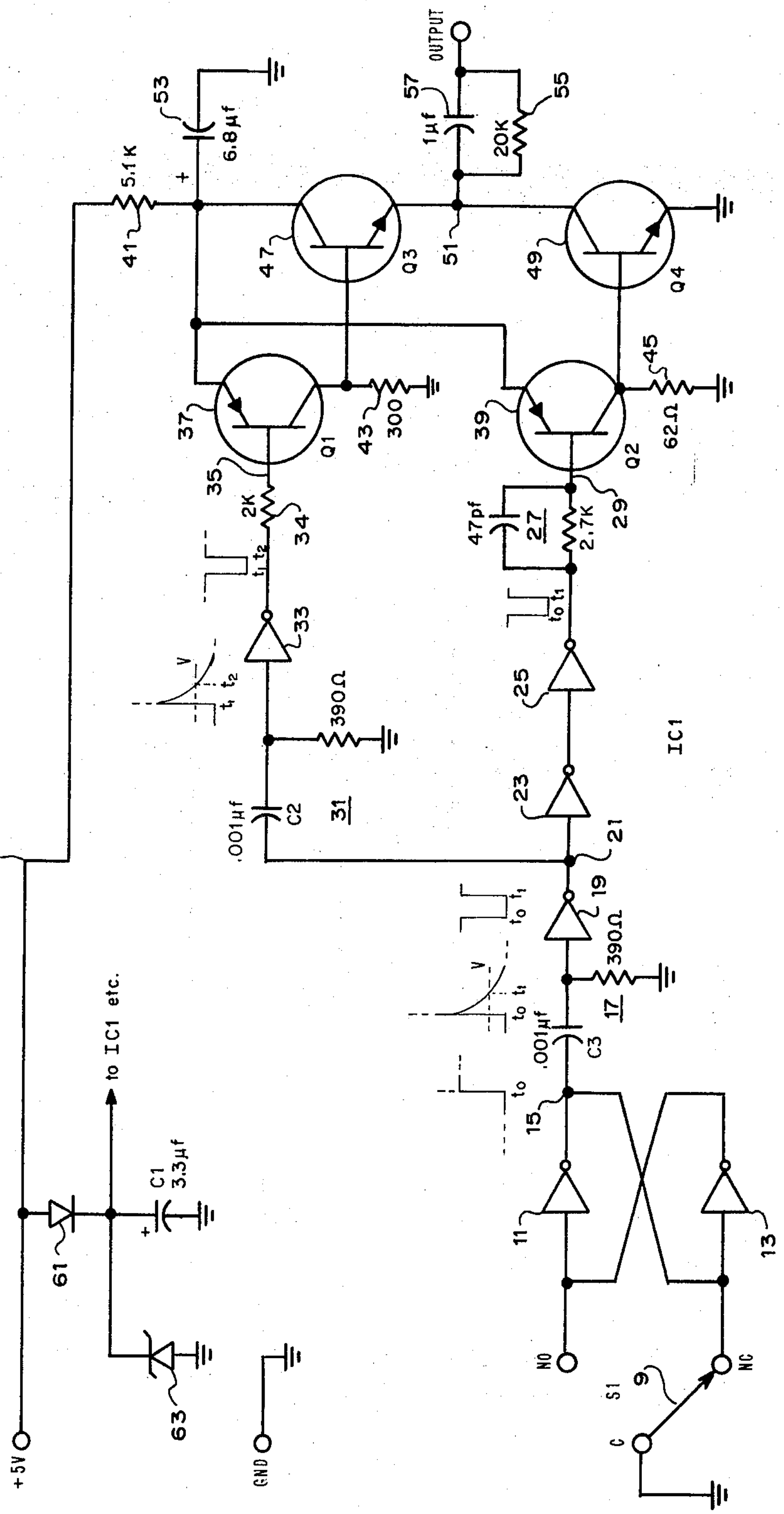

TRISTATE PULSE GENERATOR FOR PRODUCING CONSECUTIVE PAIR OF PULSES

BACKGROUND OF THE INVENTION

In contrast to analog circuitry wherein test signals may be conveniently superimposed onto selected circuit nodes, digital circuitry commonly presents conditions which prevent injection of test signals at selected circuit nodes. For example, in testing a cascaded series of gates, the gate input whose state it is desired to change may be directly coupled to the output of a preceding gate which, if operating in the low state, may clamp subsequent gate input and prevent effective injection of a test pulse by ordinary means at that circuit node. The common solution to this problem involves disconnecting the gate input from the preceding output so that the input state may be suitably controlled. However, printed circuit construction techniques make this procedure difficult, and involves unsoldering or trace cutting.

SUMMARY OF INVENTION

In accordance with the illustrated embodiment of the present invention, an improved pulse generator has three distinctive operating states that are well suited for injecting test pulses into a circuit under evaluation. Further, the present pulse generator includes manually-actuated circuitry for producing a test pulse with automatic selection of the polarity necessary to induce a state change.

DESCRIPTION OF THE DRAWING AND PREFERRED EMBODIMENT

Referring now to the drawing which shows a schematic diagram of the present invention, a manually-operated single-pole, double throw switch 9 is connected between ground and a selected one of the inputs of a pair of cross-connected inverting amplifiers 11, 13. This circuit arrangement produces a single-step output 15 (independently of contact bounce of the switch 9) which is then differentiated by the resistance-capacitance circuit 17. The resulting differentiated pulse is applied to the inverter amplifier 19 which produces an output pulse 21 that has a pulse width ($t_0 \rightarrow t_1$) equal to the time period that the differentiated pulse 15 remains above the operating threshold voltage v of amplifier 19.

The pulse 21 is applied through cascaded inverter amplifiers 23 and 25 and lead network 27 to one input 29 of the output stage and through a differentiator and inverter amplifier 31, 33 (similar to differentiator and inverter amplifier 17, 19) and resistor 34 to another input 35 of the output stage. The differentiator 31 produces a pulse of the same polarity as the pulse applied to the input of amplifier 19 in response to the trailing edge of the pulse 21 from amplifier 19, and this causes amplifier 33 to produce a pulse having a pulse width ($t_1 \rightarrow t_2$) equal to the time period that the differentiated pulse applied to the input of amplifier 33 remains above the operating threshold voltage v. The signals thus arrive at inputs 29, 35 of the output stage delayed in time but with common polarity for initial operation of switch 9. Pulses of inverted sign formed by return operation of switch 9 are not passed by amplifiers 19, 33. The amplifiers 11, 13, 19, 23, 25, and 33 may all be formed in one or more integrated circuits of conventional designs and may be biased from the supply busses, as later described.

The output stage includes a pair of input transistors 37, 39 which have base electrodes connected to receive the pulses 29 and 35 and which are biased via resistor 41 and collector loads 43, 45 to be normally non-conductive in the absence of the applied pulses. The output transistors 47, 49 have base electrodes connected to receive the respective ones of the collector loads and have collector-emitter output circuits that are serially connected through resistor 41 to the supply busses. In this arrangement, the output transistors 47, 49 are normally non-conductive and the output node 51 at the common connection of the transistor output circuits thus presents high output impedance of the order of 1,000 kilohms. This "off" operating condition is ideally suited for probing nodes of a circuit under test because the high impedance thus presented does not load down the circuit node under test. The pulses 29, 35 that are produced in the manner described in response to manual activation of switch 9 cause the transistors 39 and 49 to become conductive momentarily followed in sequence by momentary conduction of transistors 37 and 47. These two additional operating conditions cause the output node 51 to be clamped momentarily ($t_0 \rightarrow t_1$) at ground potential (or "low" state) and then, in sequence, clamped momentarily ($t_1 \rightarrow t_2$) at about the bus potential (or "high" state). After termination of the pulse 35 applied to amplifier 37, the output node 51 is again in the "off" condition of high output impedance. If a node under test is initially in the logic "low" state, the first pulse ($t_0 \rightarrow t_1$) from amplifier 49 will have substantially no effect, while the following pulse ($t_1 \rightarrow t_2$) from amplifier 47 will effect a state change at the node under test. Similarly, if the node under test is initially in the logic "high" state, then the first pulse ($t_0 \rightarrow t_1$) will effect a change at the node to a logic "low" state by clamping the node to ground momentarily through transistor 49. The subsequent pulse ($t_1 \rightarrow t_2$) thus drives the node under test to the "high" state again. This has the effect of being able to alter any logic state of a circuit node under test simply by actuating the switch 9.

In order to insure adequate drive current to alter the logic state of a circuit node under test, the output circuit includes a large capacitor 53 which serves as a source of charge for momentary delivery to the output when transistor 47 is rendered momentarily conductive. This capacitor, which is charged slowly at low initial current levels from the supply bus discharges through the parallel-connected resistor 55 and capacitor 57 into the circuit node under test for about 400 nanoseconds with a peak current of approximately one ampere. This results in extremely low average power dissipation in a component connected to a circuit node under test. The danger of accidental damage to test circuits is thus extremely remote. Resistor 55 and capacitor 57 limit the current to safe values in case of inadvertent connection of the output to high voltages.

No pulses reach transistors 37 and 39 upon return of the switch 9 to its normal contact position, and these transistors 37, 39 are returned to the non-conductive state approximately 800 nanoseconds after the initial activation of switch 9. Thus, the return of the switch 9 has no effect.

The supply bus 59 connected to resistor 41 may be connected to receive power (at +5 volts) from the circuit under test and the amplifiers 11, 13, 19, 23, 25 and 33 (in integrated circuit form) are connected to receive bias signal from the supply bus 59 through forward-conducting germanium diode 61. This provides a few tenths volt drop for bias of transistors 37, 39 relative to their respective drive amplifiers 25, 33 and provides back-bias protection against inadvertent reversal of polarity in connecting the supply bus to a source of voltage. Zener diode 63 is connected to limit the bias signal for the amplifiers to a safe maximum value.

We claim:

1. A logic pulse source comprising:

a pair of output signal stages connected to a common output, the signal stages being operable in nonconductive and conductive signal conditions for conducting signal current with respect to said common output in opposite conduction directions during operation in the respective conductive signal conditions;

circuit means connected to apply to said output signal stages a sequence of an initial and a subsequent timing pulse in response to a trigger signal applied to said circuit means, the trailing edge of the initial timing pulse and the leading edge of the subsequent timing pulse being substantially coincident for sequentially operating each of said output signal stages in the respective conductive signal condition; and actuating means for selectively applying trigger signals to said circuit means for producing said sequence of timing pulses.

2. A logic pulse source comprising:

a pair of output signal stages connected to a common output, the signal stages being operable in nonconductive and conductive signal conditions for conducting signal current with respect to said common output in opposite conduction directions during operation in the respective conductive signal conditions;

circuit means having an input and including:

pair of amplifier circuits each of which operates on signals applied thereto above a selected threshold level;

first differentiator means connected to said input and to one of said amplifier circuits, and second differentiator means connected to apply output signal from said one amplifier circuit to the other of said amplifier circuits for producing at the output of the second amplifier circuit a timing pulse having a leading edge substantially coincident with the trailing edge of the output signal from the first amplifier circuit;

means coupled to the output of the first one of said amplifier circuits for producing another timing pulse having a leading edge substantially coincident with the leading edge of the output signal from the first amplifier circuit;

said circuit means being connected to apply the timing pulses to said output signal stages in response to a trigger signal applied to the input of said circuit means for sequentially operating each of said output signal stages in the respective conductive signal condition; and actuating means for selectively applying trigger signals to the input of said circuit means for producing said sequence of timing pulses.

* * * * *